US009704739B2

(12) United States Patent
Chen et al.

(10) Patent No.: US 9,704,739 B2
(45) Date of Patent: Jul. 11, 2017

(54) SEMICONDUCTOR DEVICE PACKAGES, PACKAGING METHODS, AND PACKAGED SEMICONDUCTOR DEVICES

(71) Applicant: Taiwan Semiconductor Manufacturing Company, Ltd., Hsin-Chu (TW)

(72) Inventors: Jie Chen, New Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/447,400

(22) Filed: Jul. 30, 2014

(65) Prior Publication Data

US 2016/0035670 A1    Feb. 4, 2016

(51) Int. Cl.
*H01L 27/08*      (2006.01)
*H01L 21/768*     (2006.01)
(Continued)

(52) U.S. Cl.
CPC ........ *H01L 21/768* (2013.01); *H01L 23/3128* (2013.01); *H01L 23/49822* (2013.01); *H01L 23/5389* (2013.01); *H01L 23/552* (2013.01); *H01L 23/645* (2013.01); *H01L 24/19* (2013.01); *H01L 24/20* (2013.01); *H01L 24/97* (2013.01); *H01L 25/105* (2013.01); *H01L 25/16* (2013.01); *H01L 21/568* (2013.01); *H01L 23/49816* (2013.01); *H01L 28/10* (2013.01); *H01L 2224/04105* (2013.01); *H01L 2224/12105* (2013.01); *H01L 2224/16227* (2013.01); *H01L 2224/32145* (2013.01); *H01L 2224/48091* (2013.01); *H01L 2224/48227* (2013.01);
(Continued)

(58) Field of Classification Search
CPC ... H01L 25/16; H01L 25/105; H01L 2224/97; H01L 2224/82
USPC .......................................... 257/531; 438/106
See application file for complete search history.

(56) References Cited

U.S. PATENT DOCUMENTS 3,988,764 A    10/1976  Cline et al.
6,031,284 A     2/2000  Song
(Continued)

FOREIGN PATENT DOCUMENTS

CN      101221947       7/2008
JP      2003203982      7/2003

OTHER PUBLICATIONS

"Insights from Leading Edge," Semiconductor Manufacturing & Design Community Blog Archive, http://semimd.com/insights-from-leading-edge/2010/11/27/iftle-25-imaps-part-2-advanced-packaging/, © 2015 Extension Media, 12 pages.

(Continued)

*Primary Examiner* — Jamie C Niesz
(74) *Attorney, Agent, or Firm* — Slater Matsil, LLP

(57) ABSTRACT

Semiconductor device packages, packaging methods, and packaged semiconductor devices are disclosed. In some embodiments, a package for a semiconductor device includes a back side interconnect structure, and a winding of an inductor disposed in a material layer of the back side interconnect structure. A molding material is coupled to the back side interconnect structure. The package includes an integrated circuit die mounting region disposed within the molding material.

20 Claims, 9 Drawing Sheets

(51) Int. Cl.
- *H01L 25/10* (2006.01)
- *H01L 25/16* (2006.01)
- *H01L 23/538* (2006.01)
- *H01L 23/552* (2006.01)
- *H01L 23/64* (2006.01)
- *H01L 23/00* (2006.01)
- *H01L 23/31* (2006.01)
- *H01L 49/02* (2006.01)
- *H01L 23/498* (2006.01)
- *H01L 21/56* (2006.01)

(52) U.S. Cl.
CPC ...... *H01L 2224/73265* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/10253* (2013.01); *H01L 2924/14* (2013.01); *H01L 2924/1431* (2013.01); *H01L 2924/1434* (2013.01); *H01L 2924/1436* (2013.01); *H01L 2924/15311* (2013.01); *H01L 2924/181* (2013.01); *H01L 2924/19042* (2013.01); *H01L 2924/19105* (2013.01); *H01L 2924/3025* (2013.01)

(56) References Cited

U.S. PATENT DOCUMENTS

| | | | |
|---|---|---|---|
| 6,240,622 B1 | 6/2001 | Ahn et al. | |
| 6,531,945 B1 | 3/2003 | Ahn et al. | |
| 6,992,557 B2 | 1/2006 | Aoyagi | |
| 7,196,607 B2 * | 3/2007 | Pleskach | H01F 17/0033 257/E23.062 |
| 2002/0097129 A1 * | 7/2002 | Johnson | H01F 17/0006 336/200 |
| 2003/0141529 A1 | 7/2003 | Seto et al. | |
| 2004/0033654 A1 | 2/2004 | Yamagata | |
| 2008/0135977 A1 | 6/2008 | Meyer et al. | |
| 2008/0246126 A1 | 10/2008 | Bowles et al. | |
| 2009/0140394 A1 | 6/2009 | Bathan et al. | |
| 2010/0289126 A1 * | 11/2010 | Pagaila | H01L 23/49822 257/659 |
| 2014/0076617 A1 | 3/2014 | Chen et al. | |
| 2014/0225700 A1 * | 8/2014 | Doyle | H01F 17/0006 336/200 |
| 2014/0252595 A1 * | 9/2014 | Yen | H01L 23/498 257/737 |

OTHER PUBLICATIONS

Renesas, "Renesas Electronics Announces Development of On-Chip Inductor Technology with a Wide Inductance Variability," http://www.renesas.com/press/news/2010/news20100623.jsp, Jun. 23, 2010, 1 page.

Wood, R., et al., "Passive Integration Activates Wireless," EE Times, http://www.eetimes.com/document.asp?doc_id=1147895, Dec. 8, 2003, 3 pages.

* cited by examiner

SEMICONDUCTOR DEVICE PACKAGES, PACKAGING METHODS, AND PACKAGED SEMICONDUCTOR DEVICES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
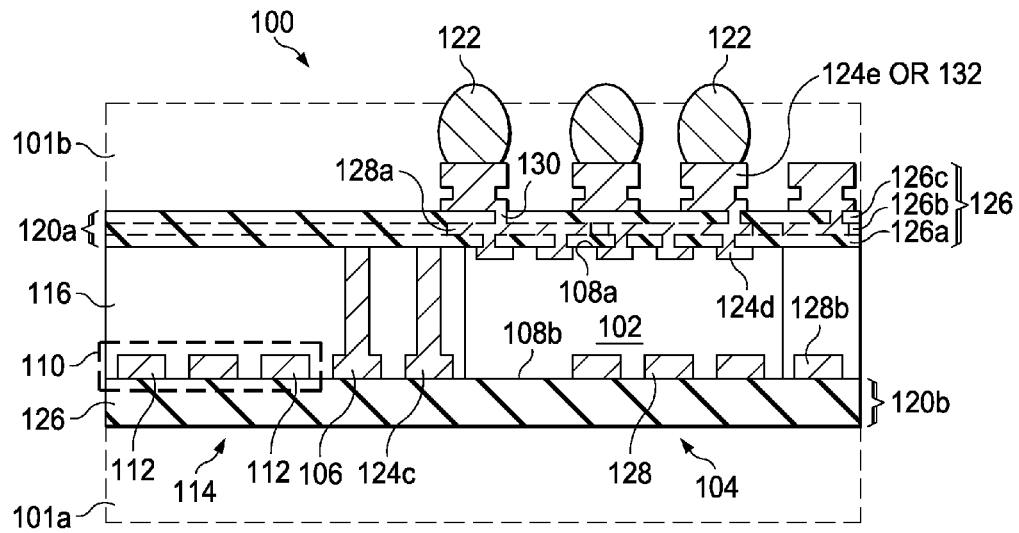
FIG. 1 is a cross-sectional view of a packaged semiconductor device in accordance with some embodiments of the present disclosure, wherein an inductor is formed in a material layer of a back side interconnect structure of the package.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel packages for semiconductor devices, methods of packaging semiconductor devices, and packaged semiconductor devices wherein an inductor is formed in a material layer of a back side interconnect structure of a package for a semiconductor device.

Referring first to FIG. 1, a cross-sectional view of a packaged semiconductor device 100 in accordance with some embodiments of the present disclosure is shown. The packaged semiconductor device 100 includes an inductor 114 that is formed in a material layer of a back side interconnect structure 120*b* of the package. For example, region 110 comprises an inductor region. The inductor region 110 is formed in the same material layer or material layers that an interconnect structure 120*b* of the package is formed in. The interconnect structure 120*b* is also referred to herein as a back side interconnect structure or a first interconnect structure, e.g., in some of the claims. The inductor region 110 includes windings 112 of an inductor 114. The inductor region 110 comprises one or more continuous portions of windings 112 of an inductor 114 in some embodiments, for example. In some embodiments, the inductor region 110 includes substantially an entire winding 112 of an inductor 114.

The packaged semiconductor device 100 includes an integrated circuit die 102 that is packaged in a package that includes a plurality of through-vias 106, a winding 112 of an inductor 114 in the inductor region 110, and a molding material 116 disposed around and between the plurality of through-vias 106 and the winding 112 of the inductor 114 in the inductor region 110. Only two through-vias 106 are shown in FIG. 1; however, the packaged semiconductor device 100 may include dozens, hundreds, or thousands of through-vias 106 formed therein. The molding material 116 comprises an insulating material in some embodiments. The molding material 116 comprises a molding compound material or an underfill material in some embodiments, for example.

The integrated circuit die 102 is disposed in an integrated circuit mounting region 104 of the package. The integrated circuit mounting region 104 is disposed within the molding material 116 in some embodiments, for example.

The package includes an interconnect structure 120a disposed over the plurality of through-vias 106, and the molding material 116 in some embodiments. The interconnect structure 120a comprises a redistribution layer (RDL) or a post-passivation interconnect (PPI) structure in some embodiments. The interconnect structure 120a may alternatively comprise other types of wiring structures. The interconnect structure 120a is also referred to herein, e.g., in some of the claims, as a front side interconnect structure or a second interconnect structure.

The integrated circuit die 102 includes a front side 108a and a back side 108b that is opposite the front side 108a. The front side 108a of the integrated circuit die 102 includes active regions that are above a top side of a silicon die. The active regions may include integrated circuitry, such as transistors, resistors, capacitors, conductive lines, vias, insulating materials, and other elements. A plurality of integrated circuits adapted to perform a predetermined function are included in the active regions of the front side 108a of the integrated circuit die 102, for example. The back side 108b of the integrated circuit die 102 comprises silicon or other semiconductive material and does not contain active regions in some embodiments.

The front side interconnect structure 120a is coupled to the front side 108a of the integrated circuit die 102, and the back side interconnect structure 120b is coupled to the back side 108b of the integrated circuit die 102. The back side interconnect structure 120b is coupled to a first side of the molding material 116, and the front side interconnect structure 120a is coupled to a second side of the molding material 116, the second side of the molding material 116 being opposite the first side.

The integrated circuit die 102 includes a plurality of contact pads 124d formed on a surface of the front side 108a in some embodiments. The through-vias 106 may also include a contact pad 124c formed on one end. In other embodiments, the through-vias 106 do not include contact pads formed on one end. Portions of the interconnect structure 120a are coupled to the contact pads 124d of the integrated circuit die 102 and/or to the through-vias 106 in some embodiments.

The front side interconnect structure 120a includes a plurality of insulating material layers 126a, 126b, and 126c in some embodiments. A plurality of conductive lines 128a and vias 130 are disposed within the plurality of insulating material layers 126a, 126b, and 126c. The insulating material layers 126a, 126b, and 126c are collectively labelled as insulating material layers 126 herein. The insulating material layers 126a, 126b, and 126c comprise a polymer or other insulating materials. The interconnect structure 120a may also include contact pads 124e or under-ball metallization (UBM) structures 132 coupled to the conductive lines 128a and/or vias 130. The conductive portions of the interconnect structure 120a comprising the conductive lines 128a, vias 130, contact pads 124e, and UBM structure 132 may comprise a conductive material such as Cu, Al, W, other metals, or alloys, combinations, or multiple layers thereof, as examples. Alternatively, the interconnect structure 120a may comprise other features and may be comprised of other materials.

Connectors 122 are coupled to the contact pads 124e or UBM structures 132 of the front side interconnect structure 120a in some embodiments. A plurality of the connectors 122 are coupled to the interconnect structure 120a in some embodiments, for example. In other embodiments, the connectors 122 are not included in the packaged semiconductor device 100. The connectors 122 comprise a eutectic material and may comprise connectors formed in a ball grid array (BGA) arrangement in some embodiments, for example. The connectors 122 may alternatively comprise other materials and arrangements.

The back side interconnect structure 120b comprises similar elements, features, and materials as described for the front side interconnect structure 120a in some embodiments. The back side interconnect structure 120b may include insulating material layers 126, conductive lines 128b, vias (not shown), and contact pads or UBM structures (also not shown), as described for the first interconnect structure 120a, for example. The second interconnect structure 120b is disposed beneath the plurality of through-vias 106, the molding material 116, and the back side 108b of the integrated circuit die 102.

In some embodiments, the packaged semiconductor device 100 is formed over one or more carriers 101a and/or 101b (shown in phantom, e.g., in dashed lines in FIG. 1), and the carriers 101a and/or 101b are later removed, to be described further herein.

In the embodiments shown in FIG. 1, no conductive portion of the interconnect structure 120a is disposed over the winding 112 of the inductor 114 in the inductor region 110. For example, no conductive portion of an RDL or a PPI structure is disposed over the winding 112 of the inductor 114 in the inductor region 110. As another example, the winding 112 of the inductor 114 is formed in a clear area of the package wherein no conductive portion of an RDL, UBM structure 132, conductive line 128a, or BGA connector 122 is formed above or below the winding 112 of the inductor 114 in the inductor region 110. The inductor region 110 comprises an exclusion zone in some embodiments wherein conductive features of an interconnect structure 120a or 120b are not formed, for example, in order to avoid interference from the inductor 114. Conductive portions of the interconnect structure 120a are formed over the through-vias 106 and integrated circuit die 102 of the package in regions other than the inductor region 110 in some of the embodiments shown in FIG. 1, for example.

The inductor 114 in the inductor region 110 is advantageously formed in a material layer of the back side interconnect structure 120b of the packaged semiconductor device 100. Thus, no additional processing steps are required to include the inductor 114 in the package. An existing lithography mask and packaging process for the back side interconnect structure 120b can advantageously be modified to include the inductor 114 in the packaged semiconductor device 100.

Figure 2:
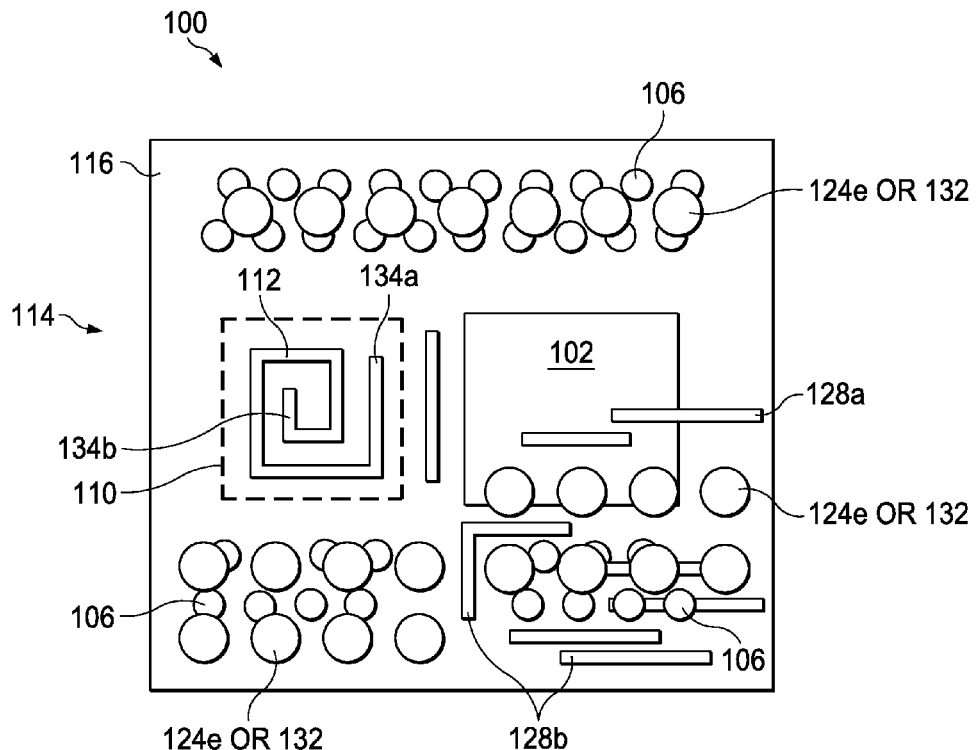
FIG. 2 is a top view illustrating a packaged semiconductor device including an inductor disposed in a material layer of a back side interconnect structure of the package in accordance with some embodiments.

FIG. 2 is a top view illustrating a packaged semiconductor device 100 that includes an inductor 114 disposed in an inductor region 110 which is formed in a material layer of a back side interconnect structure 120b of a package in accordance with some embodiments. The windings 112 of the inductor 114 in the inductor region 110 comprise a loop with substantially straight conductive lines that are connected together to form a substantially rectangular or square-shaped coil in the top view. The winding 112 of the inductor 114 comprises a continuous loop in the top view of the package in some embodiments, for example.

The inductor 114 comprises a first end 134a and a second end 134b opposite the first end 134a. The ends 134a and 134b of the inductor 114 are coupled to contact pads, vias, or other conductive features in an underlying or overlying material layer in some embodiments, so that electrical contact can be made to the inductor 114. Conductive features such as conductive lines 128b of the back side interconnect structure 120b are disposed in the same material layer that the windings 112 of the inductor 114 are formed in. Some of the contact pads 124e or UBM structures 132 may be coupled to one or more of the through-vias 106 by vias 130 and conductive lines 128a over the molding material 116. Some of the conductive lines 128a and contact pads 124e or UBM structures 132 of the interconnect structure 120a may be disposed proximate the integrated circuit die 102. Likewise, some of the conductive lines 128b, vias, and contact pads or UBM structures of the interconnect structure 120b may be disposed proximate the integrated circuit die 102. Alternatively, the packaged semiconductor device 100 may comprise other designs, shapes, and configurations.

Figure 3:
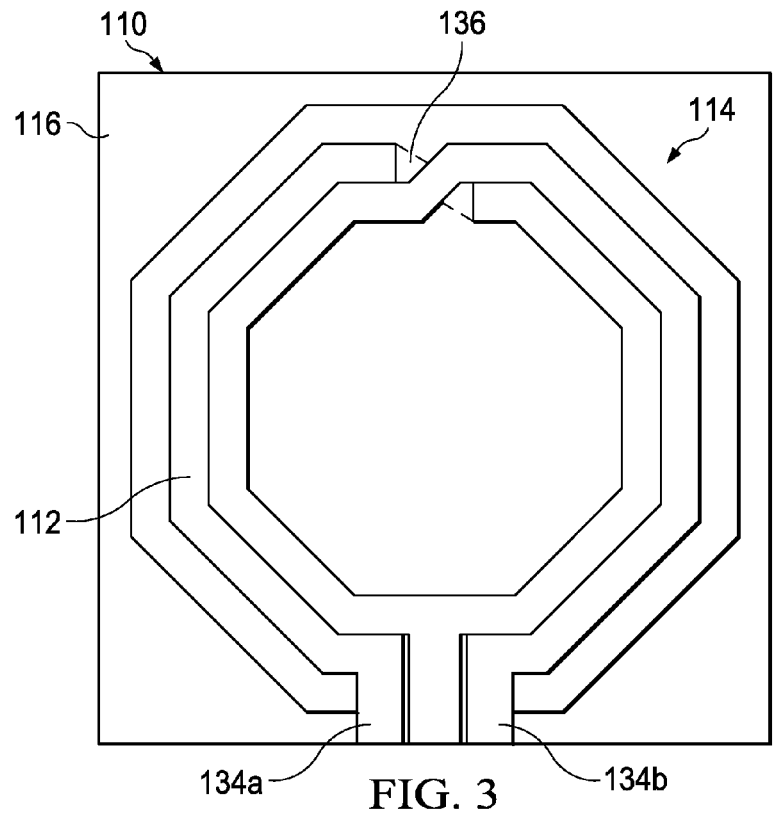
FIGS. 3 and 4 are top views illustrating shapes of inductors in accordance with some embodiments.
Figure 4:
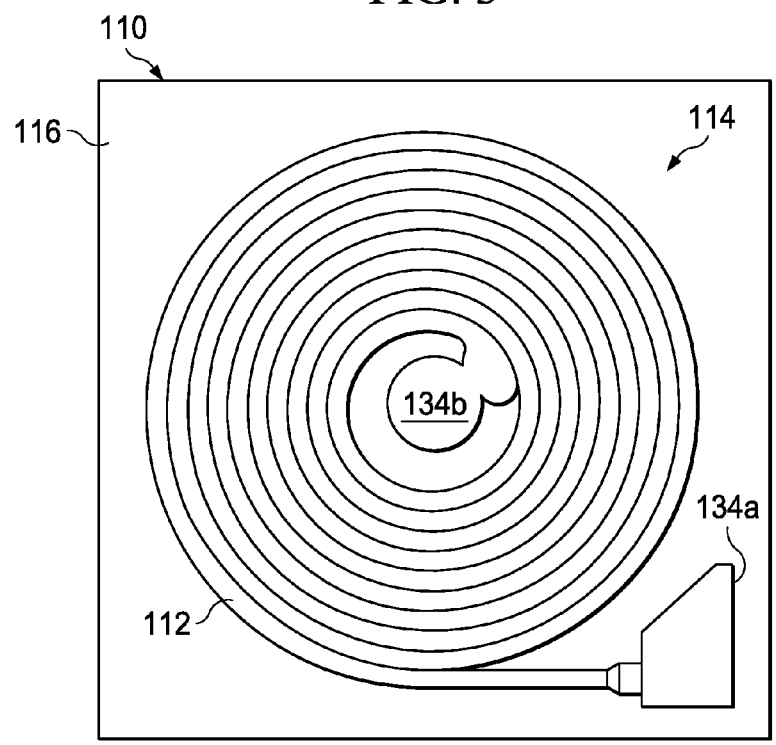

FIGS. 3 and 4 are top views illustrating shapes of inductors 114 within a semiconductor device package in accordance with some embodiments. The windings 112 of the inductors 114 in the inductor region 110 of a packaged semiconductor device 100 (see FIGS. 1 and 2) may comprise a substantially hexagon or octagon shape, as shown in in FIG. 3, in some embodiments. Cross-over regions 136 may be formed in underlying and/or overlying conductive material layers of interconnect structure 120b of the packaged semiconductor device 100. In other embodiments, the windings 112 of inductors 114 in the inductor region 110 may comprise a substantially circular shape, as shown in FIG. 4. Alternatively, the windings 112 of inductors 114 in the inductor region 110 of the package may comprise other shapes and configurations, in other embodiments.

Figure 5:
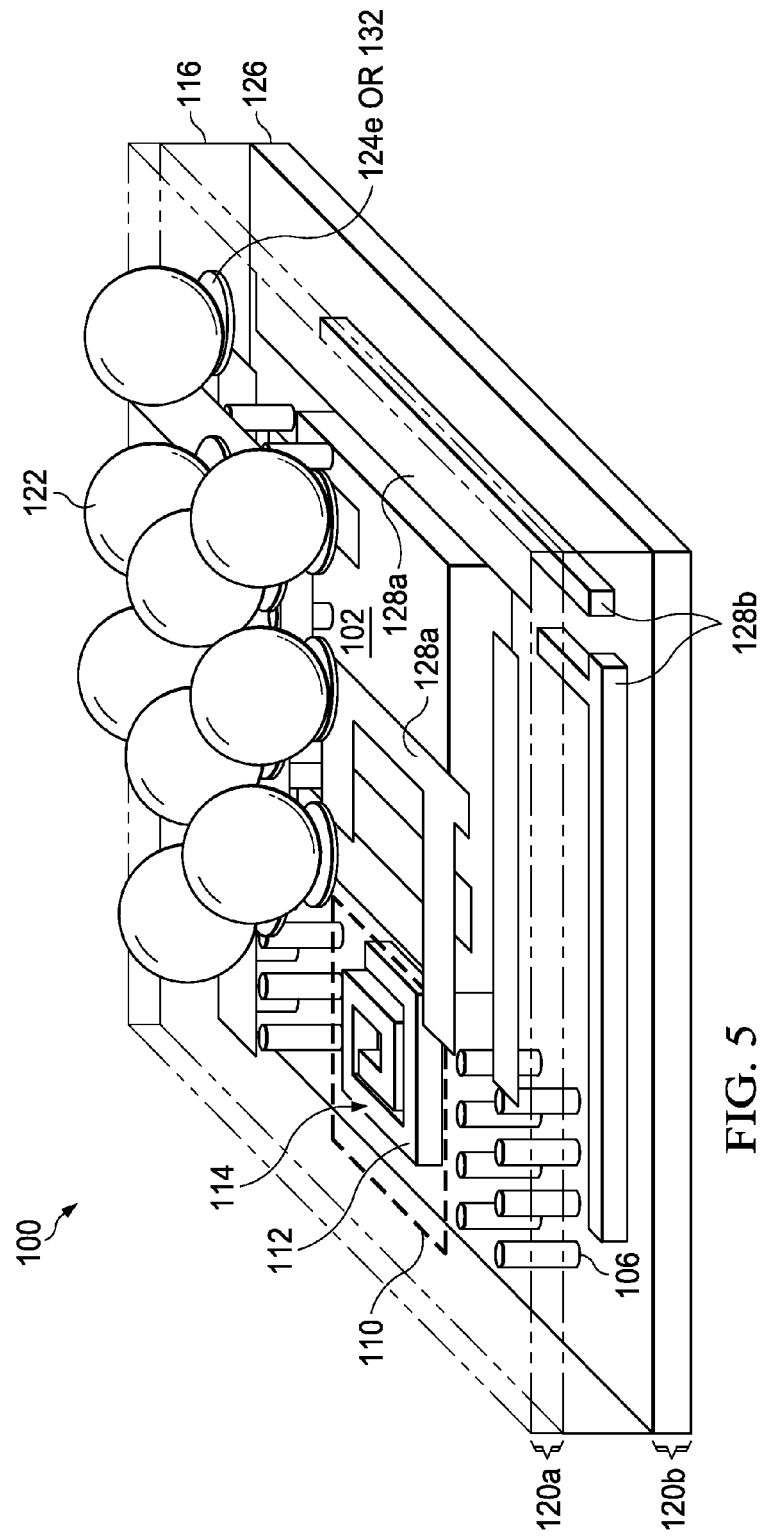
FIG. 5 is a perspective view of a portion of a packaged semiconductor device in accordance with some embodiments.

FIG. 5 is a perspective view of a portion of a packaged semiconductor device 100 in accordance with some embodiments. Some structures of the packaged semiconductor device 100 are not shown in FIG. 5 so that the inductor 114 in inductor region 110 and features proximate the inductor 114 can be illustrated. Conductive features within the front side interconnect structure 120a are not disposed over the inductor region 110 in the embodiments shown in FIG. 5. For example, no conductive portion of the front side interconnect structure 120a, such as conductive lines 128a, contact pads 124e, or UBM structure 132, is disposed over the winding 112 of the inductor 114 in the inductor region 110. Likewise, conductive portions of the back side interconnect structure 120b, such as conductive lines 128b, are not disposed in the inductor region 110.

Figure 6:
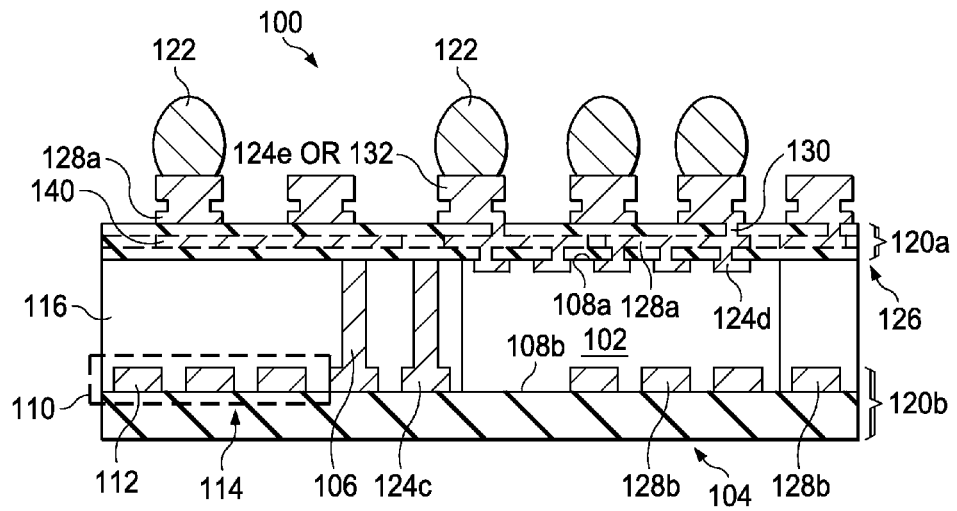
FIG. 6 is a cross-sectional view of a packaged semiconductor device in accordance with some embodiments of the present disclosure, wherein a shielding plate is disposed proximate an inductor formed in a material layer of a back side interconnect structure of the package.
Figure 7:
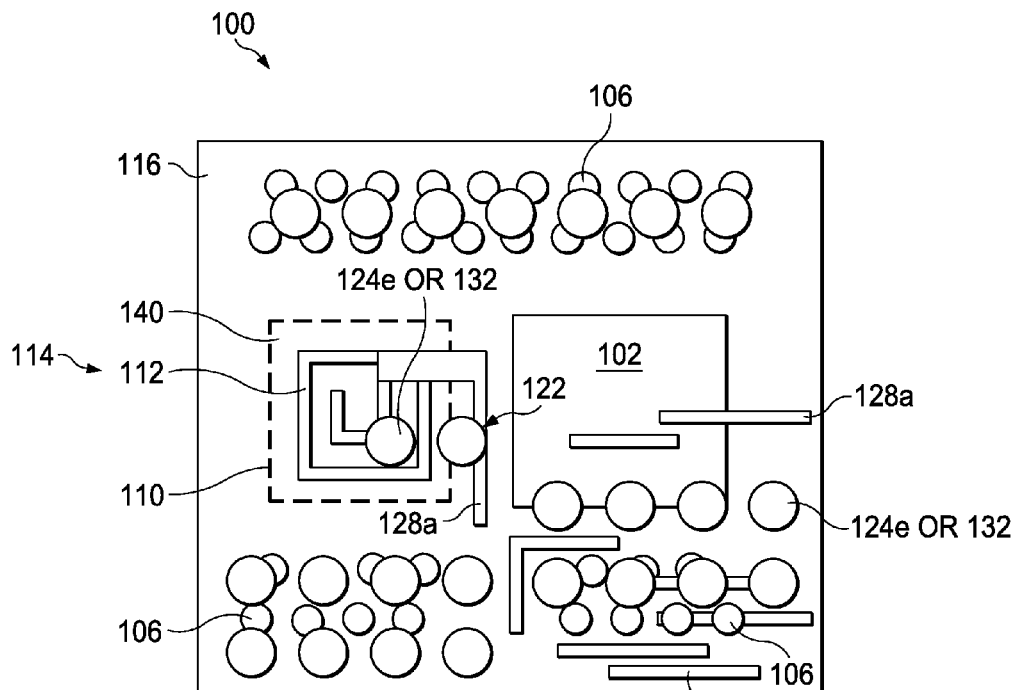
FIG. 7 is a top view illustrating a packaged semiconductor device including a shielding plate proximate an inductor in accordance with some embodiments.
Figure 8:
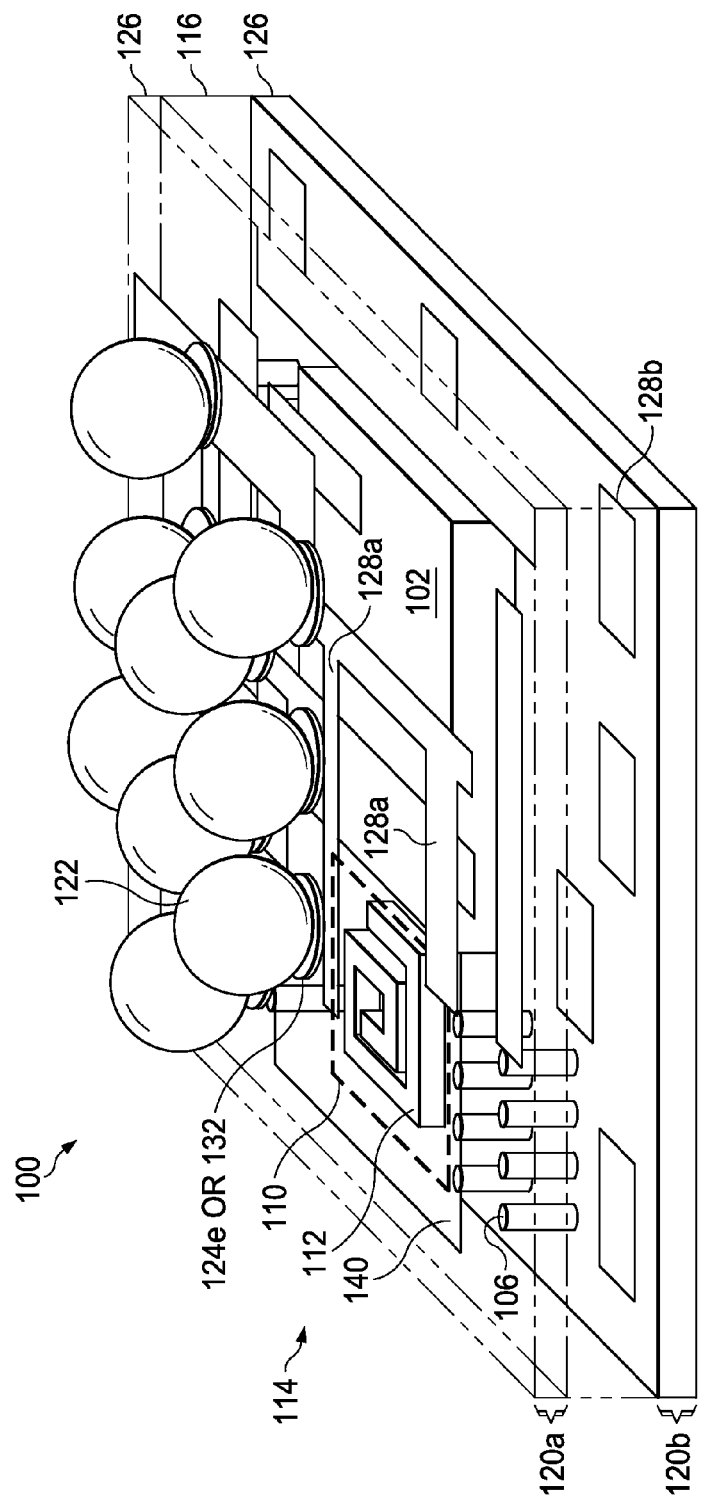
FIG. 8 is a perspective view of a portion of a packaged semiconductor device that includes a shielding plate in accordance with some embodiments.

FIG. 6 is a cross-sectional view, FIG. 7 is a top view, and FIG. 8 is a perspective view of a packaged semiconductor device 100 in accordance with some embodiments of the present disclosure, wherein a shielding plate 140 is disposed proximate an inductor 114 formed in an inductor region 110 in a material layer of a back side interconnect 120b of the package. The shielding plate 140 is formed in the same material layer that conductive lines 128a are formed in, in the front side interconnect structure 120a. Alternatively, the shielding plate 140 may be formed in the same material layer that conductive vias 130, contact pads 124e, or UBM structure 132 of the front side interconnect structure 120a are formed in, not shown. The shielding plate 140 is formed in a material layer of the front side interconnect structure 120a in some embodiments, for example. The shielding plate 140 comprises the same material as a material layer of the interconnect structure 120a in some embodiments, as another example.

Figure 11:
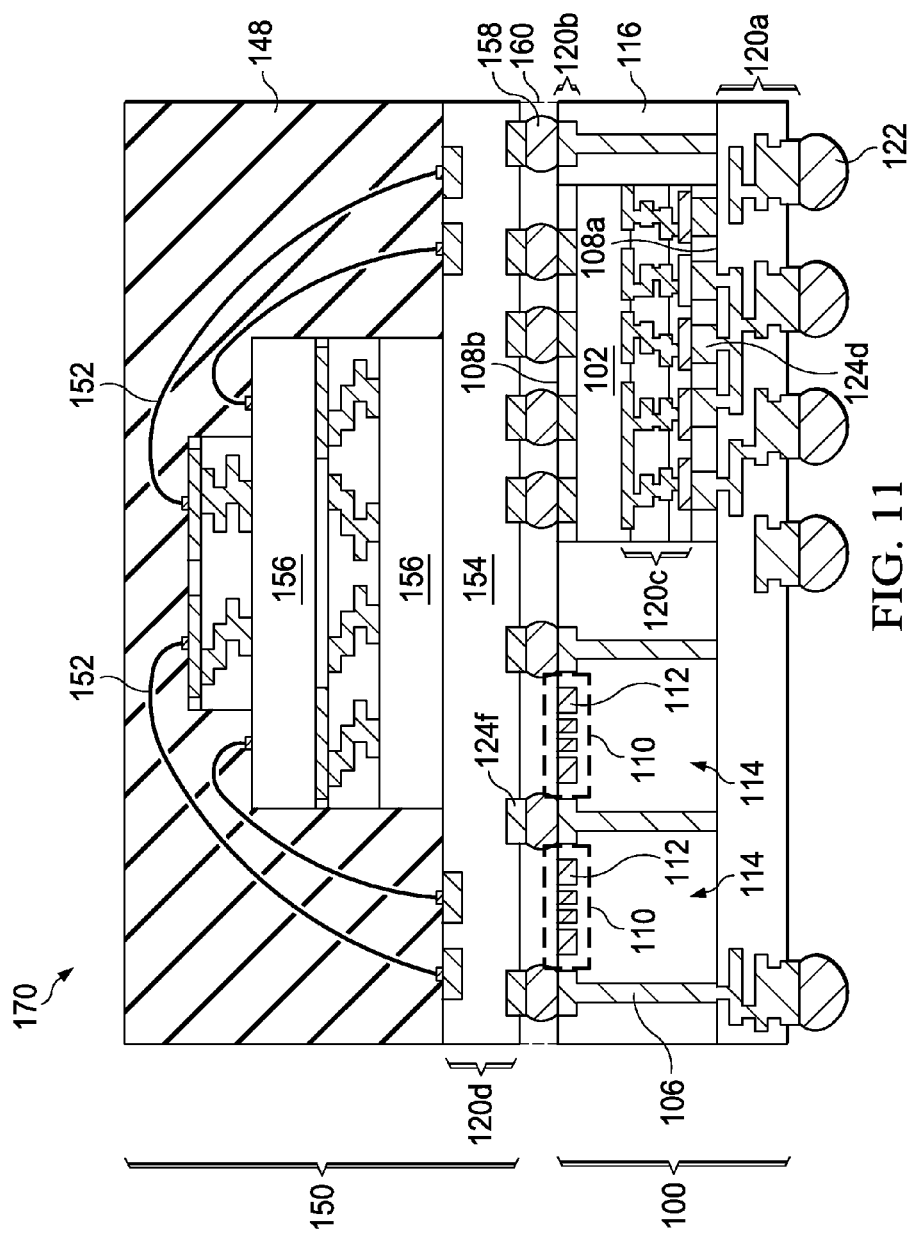
FIG. 11 is a cross-sectional view of a packaged semiconductor device in accordance with some embodiments, wherein a first packaged semiconductor device is coupled to a second packaged semiconductor device.

The shielding plate 140 disposed over (or beneath, in embodiments wherein the packaged semiconductor device 100 is inverted, as shown in FIG. 11) the inductor region 110. Because the shielding plate 140 is advantageously formed in the same material layer as a material layer of the interconnect structure 120a, no additional processing steps are required to include the shielding plate 140 in the package. An existing lithography mask and packaging process for one of the conductive material layers of the interconnect structure 120a can be modified to include the shielding plate 140 in packaged semiconductor devices 100.

In embodiments wherein a shielding plate 140 is included, a conductive portion of the front side interconnect structure 120a can be disposed over the shielding plate 140. For example, a conductive portion of an RDL or PPI structure can be disposed over the shielding plate 140, overlapping the inductor 114 or portions of the windings 112 of the inductor 114. A conductive line 128, contact pad 124e or UBM structure 132, and connector 122 are disposed over the shielding plate 140 in FIGS. 6, 7, and 8, as examples. The shielding plate 140 prevents interference from the inductor 114 from affecting other portions of the packaged semiconductor device 100.

Figure 9:
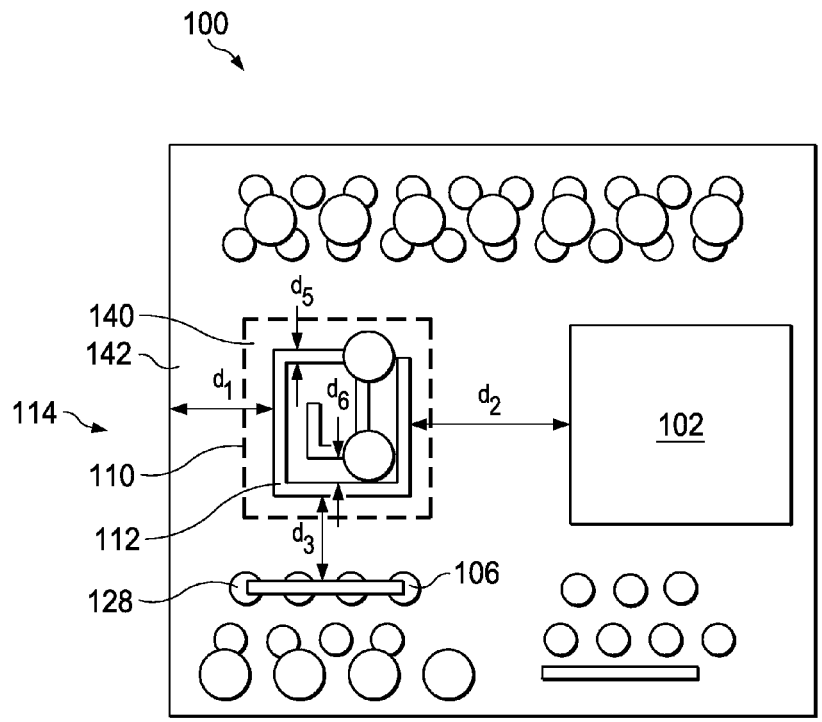
FIG. 9 is a top view of a packaged semiconductor device which illustrates some relative dimensions of an inductor within a package in accordance with some embodiments.
Figure 10:
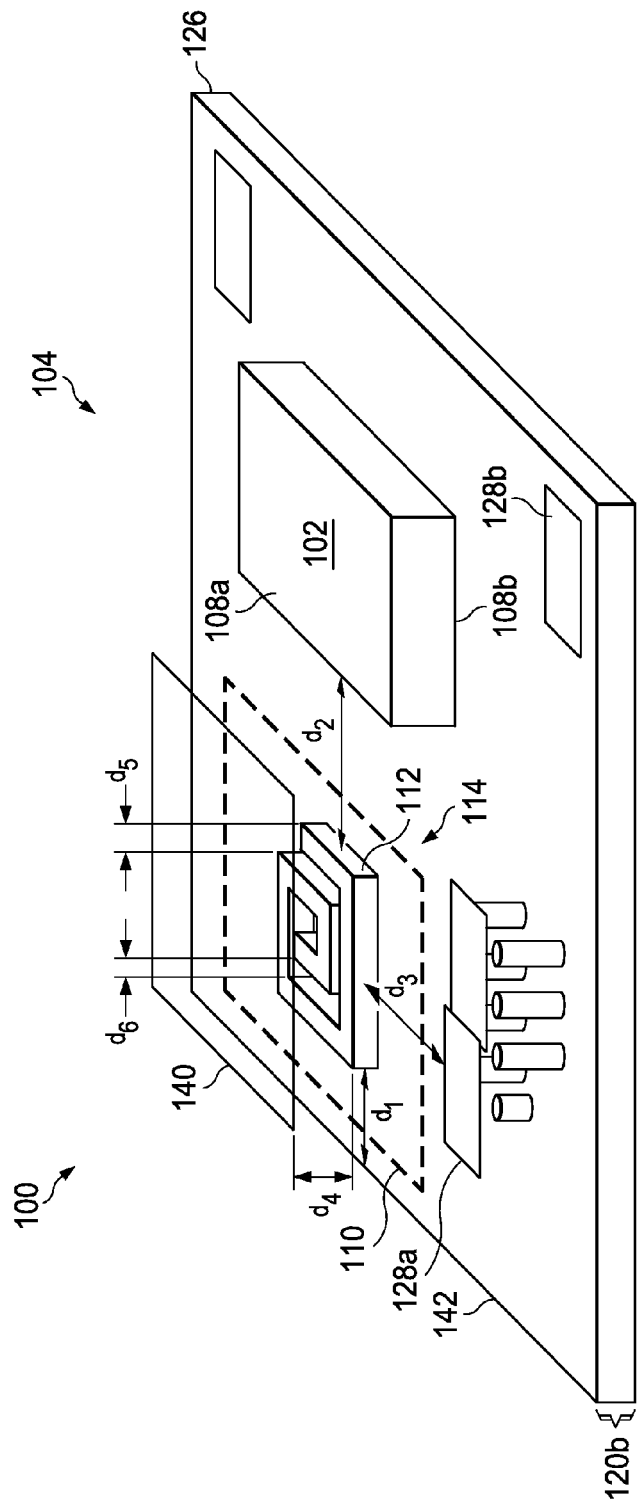
FIG. 10 is a perspective view of a packaged semiconductor device which illustrates some relative dimensions of an inductor within a package in accordance with some embodiments.

FIG. 9 is a top view, and FIG. 10 is a perspective view, of a packaged semiconductor device 100, which illustrate some dimensions and relative dimensions of the inductor 114 in the inductor region 110 within the package in accordance with some embodiments. The winding or windings 112 of the inductor 114 in the inductor region 110 are spaced apart from an edge 142 of the packaged semiconductor device 100 by a distance comprising dimension $d_1$, wherein dimension $d_1$ comprises about 80 μm or greater. The winding or windings 112 of the inductor 114 in the inductor region 110 are spaced apart from an integrated circuit die 102 in the integrated circuit die mounting region 104 by a distance comprising dimension $d_2$, wherein dimension $d_2$ comprises about 80 μm or greater. The winding or windings 112 of the inductor 114 in the inductor region 110 are spaced apart from conductive features in an overlying or underlying interconnect structure 120a or 120b such as conductive lines 128a and 128b, respectively, by a distance comprising dimension $d_3$, wherein dimension $d_3$ comprises about 20 μm or greater, in embodiments wherein a shielding plate 140 is not included. Dimension $d_3$ comprises a horizontal distance from the winding 112 to conductive structures in material layers above or below the winding 112, for example. A distance between the shielding plate 140 and conductive features in the same conductive material layer, such as a material layer conductive lines 128b are formed in, comprises about 3 μm or greater in some embodiments. There is no limitation in the distance between the winding 112 and conductive features in other conductive material layers of the front side interconnect structure 120a in embodiments wherein a shielding plate 140 is included, for example. In embodiments wherein a shielding plate 140 is included, the winding or windings 112 of the inductor 114 in the inductor region 110 are vertically spaced apart from the shielding plate 140 by a distance comprising dimension $d_4$, wherein dimension $d_4$ comprises about 40 µm or greater. The windings 112 of the inductor 114 may comprise a width comprising dimension $d_5$, wherein dimension $d_5$ comprises about 10 µm or greater, for example. Portions of the windings 112 may be spaced apart from other portions of the windings 112 by a distance comprising dimension $d_6$, wherein dimension $d_6$ comprises about 5 µm or greater, for example. Alternatively, dimensions $d_1$, $d_2$, $d_3$, $d_4$, $d_5$ and/or $d_6$ may comprise other values.

FIG. 11 is a cross-sectional view of a packaged semiconductor device 170 in accordance with some embodiments, wherein a packaged semiconductor device 100 described herein is coupled to another packaged semiconductor device 150. The packaged semiconductor device 100 is inverted from the views previously shown in the figures in FIG. 11. The packaged semiconductor device 100 comprises a first packaged semiconductor device 100 in some embodiments, and the first packaged semiconductor device 100 is coupled to a second packaged semiconductor device 150 by a plurality of connectors 158. The connectors 158 are coupled to the back side interconnect structure 120b. The connectors 158, which may comprise solder balls or other materials, are coupled between contact pads of the first packaged semiconductor device 100 and contact pads 124f of the second packaged semiconductor device 150, for example. In some embodiments, the packaged semiconductor device 170 comprises a package-on-package (PoP) device, for example.

The packaged semiconductor device 100 includes a plurality of the through-vias 106 formed within the molding material 116. The through-vias 106 provide vertical connections for the packaged semiconductor device 100. The interconnect structures 120a and 120b provide horizontal electrical connections for the packaged semiconductor device 100. The integrated circuit die 102 may include an interconnect structure 120c that includes a plurality of conductive lines and/or vias formed in one or more insulating material layers. Contact pads 124d of the integrated circuit die 102 are coupled to portions of the interconnect structure 120a. Packaged semiconductor device 150 also includes an interconnect structure 120d that provides horizontal electrical connections for the packaged semiconductor device 150.

The second packaged semiconductor device 150 includes one or more integrated circuit dies 156 coupled to a substrate 154. In some embodiments, the dies 156 comprise memory chips. For example, the dies 156 may comprise dynamic random access memory (DRAM) devices in some embodiments. Alternatively, the dies 156 may comprise other types of chips. Wire bonds 152 may be coupled to contact pads on a top surface of the integrated circuit die or dies 156, which are coupled to bond pads on the substrate 154. A molding material 148 may be disposed over the wire bonds 152, the integrated circuit die or dies 156, and the substrate 154.

Alternatively, a PoP device 170 may include two packaged semiconductor devices 100 described herein that are coupled together in some embodiments, not shown in the drawings. In some embodiments, the PoP device 170 may comprise a system-on-a-chip (SOC) device, as another example.

In some embodiments, an insulating material 160 is disposed between the packaged semiconductor devices 100 and 150 between the connectors 158, as shown in phantom in FIG. 11. The insulating material 160 may comprise an underfill material or a molding material, as examples. Alternatively, the insulating material 160 may comprise other materials, or the insulating material 160 may not be included.

Figure 12:
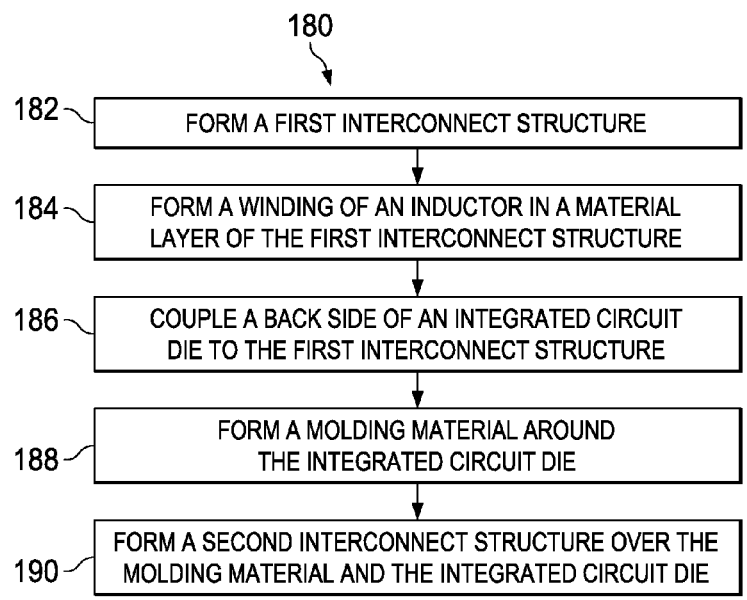
FIG. 12 is a flow chart of a method of packaging a semiconductor device in accordance with some embodiments.

FIG. 12 is a flow chart 180 of a method of packaging a semiconductor device in accordance with some embodiments. In step 182, a first interconnect structure 120b is formed (see also FIG. 1). In step 184, a winding 112 of an inductor 114 is formed in a material layer of the first interconnect structure 120b. In step 186, a back side 108b of an integrated circuit die 102 is coupled to the first interconnect structure 120b. In step 188, a molding material 116 is formed around the integrated circuit die 102. In step 190, a second interconnect structure 120a is formed over the molding material 116 and the integrated circuit die 102.

The first interconnect structure 120b is formed after forming the second interconnect structure 120a in some embodiments. In other embodiments, the second interconnect structure 120a is formed after forming the first interconnect structure 120b.

In some embodiments, a carrier 101a and/or 101b, shown in phantom in FIG. 1, is provided, and the various material layers described herein are formed over the carrier 101a and/or 101b. The carrier 101a and/or 101b is later removed. The carriers 101a and/or 101b may comprise glass, silicon oxide, aluminum oxide, or a semiconductor wafer, as examples. The carriers 101a and/or 101b may also comprise other materials.

For example, in some embodiments, the carriers 101a and 101b comprise a first carrier 101a and a second carrier 101b which are both used to package a semiconductor device. As an example of a packaging process flow, first, a plurality of through-vias 106 may be formed over the first carrier 101a. The through-vias 106 may be formed using subtractive techniques, damascene techniques, plating, or other methods. In a subtractive technique, a conductive material such as Cu, a Cu alloy, other metals, or combinations or multiple layers thereof may be formed over an entire surface of the first carrier 101a, and the conductive material is patterned to form the through-vias 106. The conductive material may be patterned using photolithography, by forming a layer of photoresist over the conductive material, exposing the layer of photoresist to light or energy reflected from or transmitted through a lithography mask having a desired pattern thereon, and developing the layer of photoresist. Exposed (or unexposed, depending on whether the layer of photoresist is positive or negative) portions of the layer of photoresist are then ashed and removed. The patterned layer of photoresist is then used as an etch mask during an etch process for the conductive material. The layer of photoresist is then removed, leaving the conductive material patterned with the desired pattern of the through-vias 106.

As another example, the through-vias 106 may be formed using a plating process. A seed layer (not shown) may be formed over the first carrier 101a, and a sacrificial layer such as an insulating material or photoresist is formed over the seed layer. The sacrificial layer is then patterned using photolithography with the desired pattern of the through-vias 106, and a plating process is used to plate a conductive material such as Cu, a Cu alloy, or other metals over the seed layer. The sacrificial layer is then removed.

Next, an integrated circuit die 102 is provided. The integrated circuit die 102 may be previously fabricated on a semiconductor wafer and singulated along scribe lines to form individual integrated circuit dies 102, for example. The integrated circuit die 102 may comprise a logic chip, a memory chip, a processor, an application specific device, or a chip having other functions, as examples. Only one integrated circuit die 102 is shown in the drawings; however, a plurality of integrated circuit dies 102 may be packaged over the first carrier 101a simultaneously, and the packaged devices are later singulated to form individually packaged dies 102 or a plurality of dies 102 packaged together in a single package. A plurality of integrated circuit dies 102 comprising the same or different functions may be packaged together in accordance with some embodiments, for example. One or more types of integrated circuit dies 102 may be packaged in a single packaged semiconductor device 100 to form a system on a chip (SoC) device in some embodiments, for example.

The integrated circuit die 102 is coupled to the first carrier 101a manually or using an automated machine such as a pick-and-place machine. The integrated circuit die 102 is coupled to the first carrier 101a in the integrated circuit die mounting region 104 using an adhesive or a die attach film (DAF), not shown.

In some embodiments, the integrated circuit die 102 may first be coupled to the first carrier 101a, and the through-vias 106 may then be formed over the first carrier 101a.

Molding material 116 is formed over the first carrier 101a over the through-vias 106 and the integrated circuit die 102. As applied, the molding material 116 extends over a top surface of the die 102 and through-vias 106 in some embodiments. The molding material 116 is formed around the integrated circuit die 102 and around the plurality of through-vias 106, and between the through-vias 106 and integrated circuit die 102. The molding material 116 may be molded using compressive molding, transfer molding, or other methods. The molding material 116 encapsulates the integrated circuit dies 102 and the through-vias 106, for example. The molding material 116 may comprise an epoxy, an organic polymer, or a polymer with or without a silica-based or glass filler added, as examples. In some embodiments, the molding material 116 comprises a liquid molding compound (LMC) that is a gel type liquid when applied. Alternatively, the molding material 116 may comprise other insulating and/or encapsulating materials, or other materials.

In some embodiments, the molding material 116 is applied so that it extends to top surfaces of the integrated circuit dies 102. The top surface of the molding material 116 is substantially coplanar with top surfaces of the integrated circuit dies 102 and the through-vias 106 in some embodiments, for example.

If the molding material 116 extends over top surfaces of the integrated circuit dies 102 and the through-vias 106 after the molding material 116 is applied, the molding material 116 is removed from over the top surfaces of the integrated circuit dies 102 and the through-vias 106 using a grinding process and/or a chemical mechanical polishing (CMP) process in some embodiments. The molding material 116 is left remaining between and around the integrated circuit dies 102 and the through-vias 106.

Next, the molding material 116 is cured using a curing process in some embodiments. The curing process may comprise heating the molding material 116 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 116 may be cured using other methods. In some embodiments, a curing process is not required for the molding material 116.

The interconnect structure 120a is formed over the front side 108a of the integrated circuit die 102, the plurality of through-vias 106, and the molding material 116 in some embodiments. In some embodiments, the shielding plate 140 shown in FIGS. 6, 7, and 8 is formed in one of the conductive material layers of the interconnect structure 120a, when the interconnect structure 120a is formed. The shielding plate 140 is formed simultaneously with the formation of one of the material layers of the interconnect structure 120a in some embodiments. The shielding plate 140 is formed over or proximate the winding 112 of the inductor 114 in some embodiments, for example.

In some embodiments, a plurality of connectors 122 is then formed on the interconnect structure 120a. The connectors 122 are formed on contact pads 124e or UBM structures 132 of the interconnect structure 120a, for example. The connectors 122 comprise a eutectic material such as solder, and may comprise solder balls or solder paste in some embodiments. The connectors 122 may include other types of electrical connectors, such as microbumps, controlled collapse chip connection (C4) bumps, or pillars, and may include conductive materials such as Cu, Sn, Ag, Pb, or the like.

In some embodiments, a second carrier 101b is then coupled to the connectors 122 and to the interconnect structure 120a. The second carrier 101b may be coupled to the connectors 122 and to the interconnect structure 120a using a temporary adhesive, for example. The first carrier 101a is then removed or de-bonded. The back side interconnect structure 120b is then formed on the back side 108b of the integrated circuit die 102. The second interconnect structure 120b comprises similar materials and features as described for the first interconnect structure 120a, for example.

A plurality of connectors 158 is coupled to the second side 176 of the packaged semiconductor device 100 in some embodiments, as shown in FIG. 11. The connectors 158 comprise similar materials and formation methods as described for connectors 122 in some embodiments, for example. The connectors 158 are coupled to ends of the through-vias 106 and/or to conductive features of the back side interconnect structure 120b in some embodiments. The connectors 158 can be coupled to contact pads (not shown) of the second interconnect structure 120b, as another example. The second carrier 101b and adhesive are then removed or debonded from a plurality of the packaged semiconductor devices 100, and the packaged semiconductor devices 100 are singulated using a saw blade or laser along scribe lines.

The packaged semiconductor devices 100 can then be electrically and mechanically coupled to another packaged semiconductor device, to a printed circuit board (PCB), or in an end application or to another object using the connectors 122 and/or 158.

In other embodiments, only one carrier 101a or 101b is used to package a semiconductor device. For example, referring again to FIG. 1, in some embodiments, a carrier 101a is provided, and the back side interconnect structure 120b is formed over the carrier 101a, using a plurality of deposition processes, lithography processes, and etch processes. Through-vias 106 are formed over the back side interconnect structure 120b using a plating process or subtractive etch process. Integrated circuit dies 102 are coupled to the back side interconnect structure 120b, and the molding material 116 is disposed around the integrated circuit dies 102 and through-vias 106. Excess molding material 116 may be removed from top surfaces of the dies 102 and through-vias 106 using a grinding and/or CMP process. The through-vias 106 may also be formed after the molding material 116 is applied, by patterning or drilling openings in the molding material 116 and filling the openings with conductive material. The front side interconnect structure 120a is then formed over the molding material 116, through-vias 106, and integrated circuit dies 102. Connectors 122 are formed over the front side interconnect structure 120a in some embodiments. The interconnect structures 120a and 120b and the molding material 116 are then diced to form packaged semiconductor devices 100.

As another example, in other embodiments, a carrier 101b is provided, and the front side interconnect structure 120a is formed over the carrier 101a, using a plurality of deposition processes, lithography processes, and etch processes. Through-vias 106 are formed over the front side interconnect structure 120a using a plating process or subtractive etch process. Integrated circuit dies 102 are coupled to the front side interconnect structure 120a, and the molding material 116 is disposed around the integrated circuit dies 102 and through-vias 106. Excess molding material 116 may be removed from top surfaces of the dies 102 and through-vias 106 using a grinding and/or CMP process. The through-vias 106 may also be formed after the molding material 116 is applied, by patterning or drilling openings in the molding material 116 and filling the openings with conductive material. The back side interconnect structure 120b is then formed over the molding material 116, through-vias 106, and integrated circuit dies 102. Connectors 122 are formed over the front side interconnect structure 120a in some embodiments. The interconnect structures 120a and 120b and the molding material 116 are then diced to form packaged semiconductor devices 100.

Only one inductor 114 and one inductor region 110 is shown in the drawings; alternatively, a plurality of inductors 114 and a plurality of inductor regions 110 may be included in back side interconnect structures 120b of a packaged semiconductor device 100 in accordance with some embodiments of the present disclosure.

Figure 13:
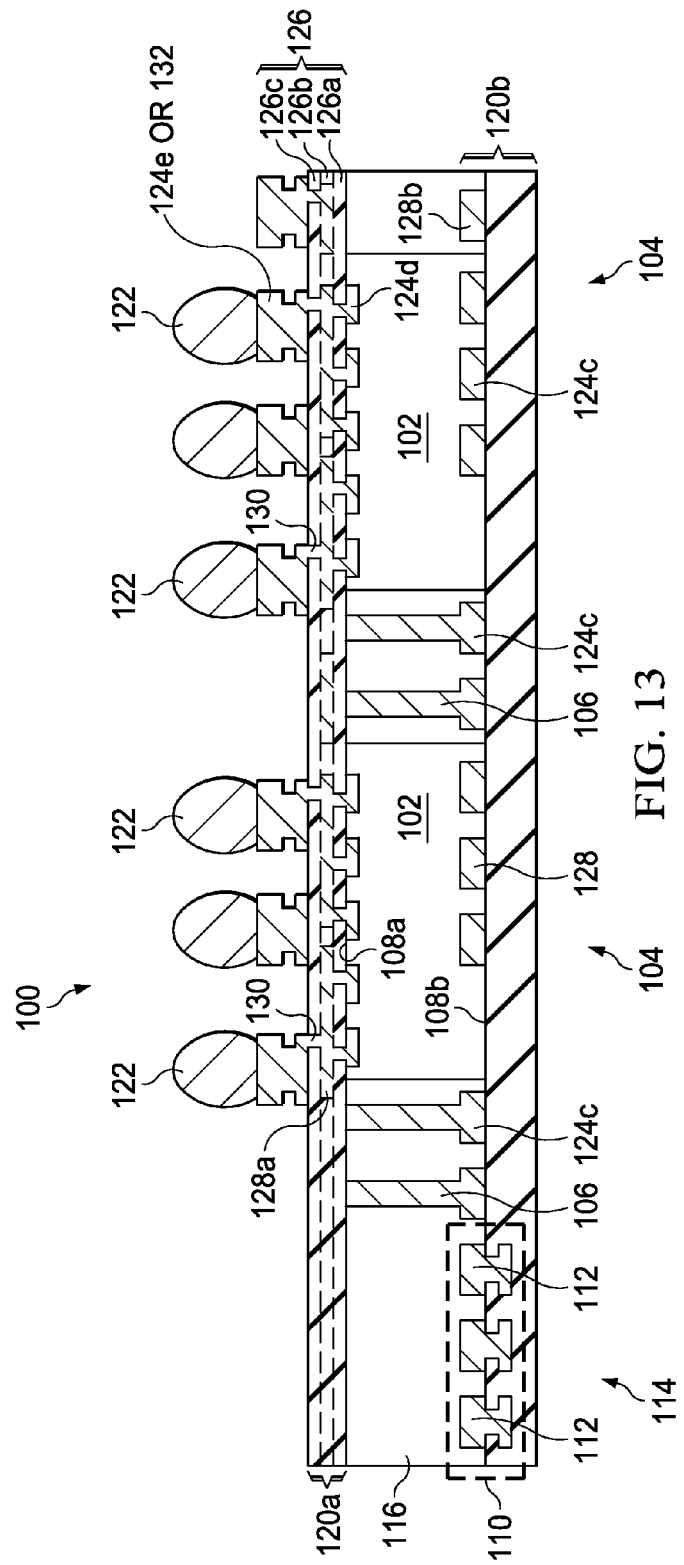
FIG. 13 is a cross-sectional view of a packaged semiconductor device in accordance with some embodiments, wherein a plurality of integrated circuit dies are packaged together, and wherein an inductor is formed in a plurality of material layers of a back side interconnect structure of the package.

FIG. 13 is a cross-sectional view of a packaged semiconductor device 10 in accordance with some embodiments, wherein a plurality of integrated circuit dies 102 are packaged together. One or more integrated circuit dies 102 can be packaged in a single package using the packaging methods described herein, for example. FIG. 13 also illustrates that an inductor 114 can be formed in a plurality of material layers of a back side interconnect structure 120b of the package. The windings 112 of the inductor 114 may be formed in a stack within conductive line and/or via layers of the back side interconnect structure 120b, for example.

Some embodiments of the present disclosure include packages for semiconductor devices, and methods of packaging semiconductor devices. Other embodiments include packaged semiconductor devices 100 that have been packaged using the novel methods described herein.

Some advantages of embodiments of the present disclosure include providing novel packaging structures and methods wherein inductors are fabricated in back side interconnect structure of a package. The novel inductors have a low amount of resistance and avoid interference under or over patterns of a packaged semiconductor device. No additional packaging process steps, lithography masks, lithography processes, or costs are required to include the inductors in semiconductor device packages. Inductors with improved performance and high quality factors are achieved by including the inductor patterns in the back side interconnect structures of the packages. The novel inductors are embedded in back side interconnect structures and can be used to decrease interference in packaged semiconductor devices. Furthermore, the inductors and novel packaging methods and structures described herein are easily implementable in manufacturing and packaging process flows.

In some embodiments, a package for a semiconductor device includes a back side interconnect structure, a winding of an inductor disposed in a material layer of the back side interconnect structure, and a molding material coupled to the back side interconnect structure. The package includes an integrated circuit die mounting region disposed within the molding material.

In some embodiments, a packaged semiconductor device includes an integrated circuit die, a molding material disposed around the integrated circuit die, and a plurality of through-vias disposed within the molding material. An interconnect structure is coupled to the molding material, the plurality of through-vias, and a back side of the integrated circuit die. A winding of an inductor is disposed within a material layer of the interconnect structure.

In other embodiments, a method of packaging a semiconductor device includes forming a first interconnect structure, forming a winding of an inductor in a material layer of the first interconnect structure, and coupling a back side of an integrated circuit die to the first interconnect structure. The method includes forming a molding material around the integrated circuit die, and forming a second interconnect structure over the molding material and the integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package for a semiconductor device, comprising:
a back side interconnect structure having a first major surface;
a winding of an inductor disposed in a material layer of the back side interconnect structure, the inductor having an axis of winding that is normal to the first major surface of the back side interconnect structure;
a molding material, a first side of the molding material coupled to the back side interconnect structure, the molding material encapsulating an upper portion of the inductor;
a through-via in the molding material;
an integrated circuit die disposed within the molding material, wherein the through-via is interposed between the inductor and the integrated circuit die; and
a metal shielding plate disposed over a second side of the molding material, the second side being opposite the first side, the metal shielding plate having a second major surface parallel to the second side of the molding material, the metal shielding plate covering the entirety of the inductor in a plan view, the integrated circuit die and the through-via being free of coverage by the metal shielding plate in the plan view.

2. The package according to claim 1, further comprising a plurality of through-vias disposed within the molding material.

3. The package according to claim 1, wherein the winding of the inductor comprises a continuous loop in a plan view of the package.

4. The package according to claim 1, wherein the package further comprises a front side interconnect structure coupled to the second side of the molding material.

5. The package according to claim 4, wherein the front side interconnect structure comprises conductive lines, contact pads, or an underball metallization (UBM) structure, and
wherein the conductive lines, contact pads, or the UBM structure of the front side interconnect structure are not disposed proximate the winding of the inductor in the material layer of the back side interconnect structure.

6. The package according to claim 4, wherein the front side interconnect structure comprises a shielding plate, and wherein the shielding plate is disposed proximate the winding of the inductor in the material layer of the back side interconnect structure.

7. The package according to claim 6, wherein the front side interconnect structure comprises conductive lines, contact pads, or an underball metallization (UBM) structure, and
wherein a portion of the conductive lines, contact pads, or the UBM structure is disposed proximate the winding of the inductor in the material layer of the back side interconnect structure.

8. A packaged semiconductor device, comprising:
a first package semiconductor device comprising:
an integrated circuit die;
a molding material disposed around the integrated circuit die, the molding material having a top surface level with the integrated circuit die;
a plurality of through-vias disposed within the molding material;
an interconnect structure coupled to a bottom surface of the molding material, the plurality of through-vias, and a back side of the integrated circuit die, the interconnect structure having a major surface;
an inductor, the inductor having a top-most surface below the top surface of the molding material; and
a winding of the inductor at least partially disposed below an upper-most surface of the interconnect structure and at least partially disposed above the bottom surface of the molding material, the bottom surface of the molding material above the upper-most surface of the interconnect structure, the inductor having an axis of winding that is normal to the major surface of the interconnect structure, the winding of the inductor different than the interconnect structure.

9. The packaged semiconductor device according to claim 8, wherein the winding of the inductor is continuous.

10. The packaged semiconductor device according to claim 8, wherein the interconnect structure comprises a redistribution layer (RDL) or a post-passivation interconnect (PPI) structure.

11. The packaged semiconductor device according to claim 8, further comprising a shielding plate disposed proximate the winding of the inductor.

12. The packaged semiconductor device according to claim 11, wherein the interconnect structure comprises a first interconnect structure, wherein the first package semiconductor device further comprises a second interconnect structure coupled to a front side of the integrated circuit die, and wherein the shielding plate is disposed in a material layer of the second interconnect structure.

13. The packaged semiconductor device according to claim 8, wherein a second package semiconductor device is coupled to the first package semiconductor device by a plurality of connectors.

14. The packaged semiconductor device according to claim 13, wherein the plurality of connectors is coupled to the interconnect structure.

15. A packaged semiconductor device, comprising:
an integrated circuit die;
a molding compound encapsulating the integrated circuit die, the molding compound having a first surface and a second surface opposite the first surface;
a through via embedded in the molding compound and extending from the first surface to the second surface;
a first portion of an inductor winding at least partially embedded in the molding compound adjacent the first surface, the inductor winding having an axis about which the inductor winding winds that is normal to the first surface and the second surface of the molding compound, the inductor winding different than the through via, the inductor having the entirety of a top surface contacting the molding compound;
a first interconnect structure on the first surface and being electrically connected to the inductor winding, a second portion of the inductor winding at least partially embedded in the first interconnect structure; and
a second interconnect structure on the second surface and being electrically connected to the through via or the integrated circuit die or both, the second interconnect structure comprising conductive lines and vias, in a plan view the second interconnect structure extending over the inductor winding being free of conductive lines and vias.

16. The packaged semiconductor device according to claim 15, wherein the second portion of the inductor winding is part of the first interconnect structure.

17. The packaged semiconductor device according to claim 15, further comprising a second exclusion zone extending under the inductor winding, the second exclusion zone being defined by absence of a first interconnect structure conductor and absence of a second interconnect structure conductor extending into the second exclusion zone.

18. The packaged semiconductor device according to claim 15, further comprising a shielding plate adjacent the inductor winding.

19. The packaged semiconductor device according to claim 15, wherein the inductor winding is in a shape of a rectangular spiral pattern.

20. The packaged semiconductor device according to claim 15, wherein the first interconnect structure comprises a plurality of levels of metal interconnects embedded within respective insulating layers.

* * * * *